United States Patent [19]

Spinks et al.

[11] 4,287,442
[45] Sep. 1, 1981

[54] EDGE SENSE LATCH

[75] Inventors: Brian M. Spinks, Austin; John R. Dumas, Round Rock, both of Tex.

[73] Assignee: Motorola, Inc., Schaumburg, Ill.

[21] Appl. No.: 14,797

[22] Filed: Feb. 26, 1979

[51] Int. Cl.³ .................... H03K 5/153; H03K 3/356
[52] U.S. Cl. ................................. 307/510; 307/246; 307/247 R; 307/279
[58] Field of Search ............ 307/232, 279, 291, 350, 307/352, 247 R, DIG. 3, 246

[56] References Cited

U.S. PATENT DOCUMENTS

| 3,921,011 | 11/1975 | Orgill ............................ 307/279 X |
| 3,976,949 | 8/1976 | Hepworth et al. .............. 307/279 X |
| 4,082,966 | 4/1978 | Lou ........................... 307/DIG. 3 X |
| 4,112,296 | 9/1978 | Heimbigner et al. ........... 307/291 X |
| 4,224,533 | 9/1980 | Lai ................................ 307/279 X |

*Primary Examiner*—Larry N. Anagnos

*Attorney, Agent, or Firm*—Anthony J. Sarli, Jr.; Vincent Ingrassia; Jeffrey Van Myers

[57] ABSTRACT

An MOS logic circuit is provided which generates and latches an output signal at a given logic level upon detection of a given transition in an input signal coinciding with a given state of a clock signal. The circuit utilizes the capacitance inherent in an MOS structure. The circuit requires a minimum of MOS components and is therefore useful in high density MOS integrated circuits where it is desired to detect and latch a transition in a signal.

The edge sense latch comprises an MOS inverter (Q1, Q2) responsive to an input signal S, a transmission gate (Q3) controlled by a clock signal, a transmission gate (Q4) controlled in part by an inherent capacitance (29), a latch comprising a pair of cross-coupled MOS transistors (Q5, Q8) for generating an output signal Q, and an MOS transistor (Q6) responsive to a reset signal R.

10 Claims, 3 Drawing Figures

EDGE SENSE LATCH

TECHNICAL FIELD

This invention relates generally to digital logic circuitry and, more particularly, to an edge sense latch.

BACKGROUND ART

In many types of digital logic circuitry it is often desirable to sense a transition in a particular signal and generate a latched output signal representative of such transition for as long as such output signal is required. The signal whose transition or "edge" is detected may be any variety of signal present within the digital logic circuitry, and the corresponding latched signal may be used for any number of purposes. Generally, the latched signal remains in the state representative of the detected condition until such time as it is no longer required, irrespective of further transitions in the detected signal. The latched signal may be reset to its original state by application of a reset signal to appropriate reset circuitry. To eliminate the detection of undesired transitions in the detected signal, the edge sense latch may be controlled by a control or clock signal, so that only those transitions occurring during a predetermined level of such control or clock signal are detected and latched.

A known prior art edge sense latch comprises a pair of cross-coupled NOR gates. One of such NOR gates receives as an input thereto the output of a third NOR gate. One input to the third NOR gate receives a signal whose transition is to be detected, and the other input of the third NOR gate receives the output of a signal delaying means, such as a sequence of series-connected inverters, which delay means is itself responsive to the signal whose transition is to be detected. The prior art edge sense latch requires a relatively large number of MOS components to implement and thus consumes a relatively large amount of silicon area.

As large and medium scale MOS devices become increasingly dense and complex, the provision of simplified, yet efficient MOS logic elements becomes mandatory. The present invention meets the demand for a small, effective edge sense latch by utilizing a minimum of MOS components and by making use of the inherent capacitance existing between the physical layers of an MOS device. By utilizing the present invention in medium and large scale MOS devices requiring edge sensing and latching circuitry, the size and complexity of such devices can be considerably reduced, resulting in the production of more cost competitive and error-free devices. Moreover, by requiring fewer MOS components, the power requirements of MOS devices utilizing the present invention are reduced.

BRIEF SUMMARY OF THE INVENTION

It is an object of the present invention to provide an improved edge sense latch circuit for detecting and latching a predetermined transition in a signal input thereto.

It is also an object of the present invention to provide an edge sense latch which utilizes the inherent capacitance in MOS components.

It is a further object of the present invention to provide an edge sense latch requiring a minimum of MOS components.

These and other objects of the invention are achieved in accordance with a preferred embodiment of the invention by providing an MOS inverter circuit which is responsive to an input signal having first and second states, a control and storage circuit coupled to the output of the inverter circuit and responsive to a clock signal having first and second states. The control and storage circuit further comprises a gate means which is conductive when the input signal and the clock signal are in their respective first states or when the inherent capacitance in the MOS structure of the control and storage circuit contains a predetermined level of charge. Coupled to the output of the gate means is a latch circuit comprising a pair of cross-coupled MOS components or transistors. The latch circuit generates an output signal which is normally set to a first state but which is set to a second state when the capacitance in the control and storage circuit contains such predetermined level of charge and coincidentally the input signal switches to its second state. Means are provided for resetting the latch circuit to its original state.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE INVENTION

Figure 1:
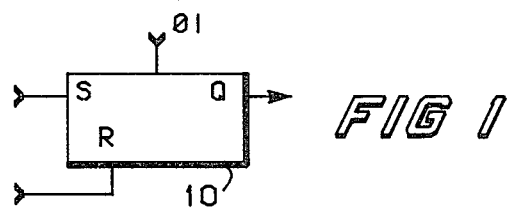
FIG. 1 shows a symbolic representation of a preferred embodiment of the invention indicating the inputs and outputs thereof.
Figure 3:
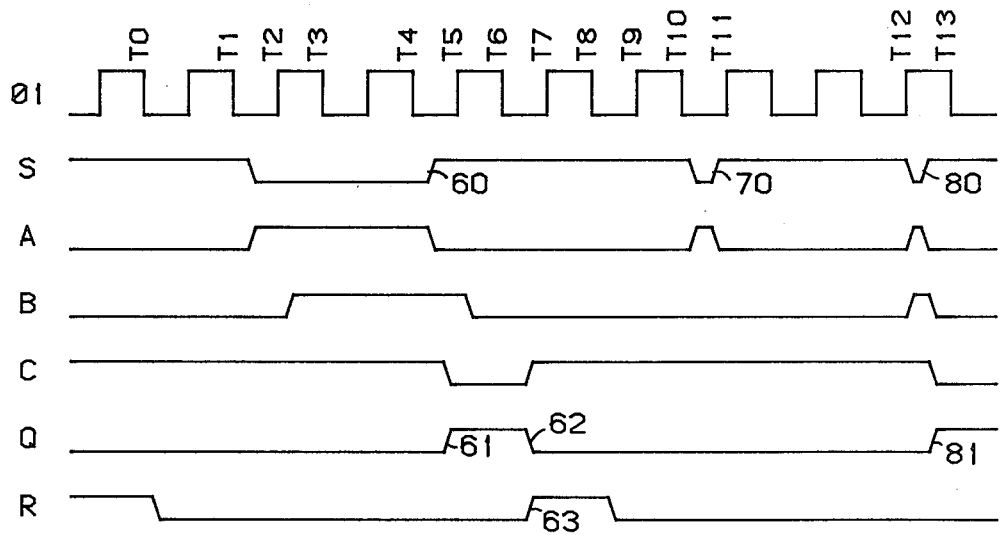
FIG. 3 is a timing diagram illustrating the operation of a preferred embodiment of the present invention.

Referring to FIG. 1, a symbolic representation 10 of a preferred embodiment of the present invention is illustrated. The present invention detects a particular transition in an input signal S and latches an output signal Q at a given level. For example, as illustrated in FIG. 3, a rising edge 60 in signal S produces a corresponding rising edge 61 in output signal Q, and signal Q remains latched in its high state until the circuit is reset by application of a positive-going pulse 63 of a reset signal R. The operation of the edge sense latch 10 is controlled by a control or clock signal $\phi 1$, such that signal S must have been in a low state during at least a portion of a $\phi 1$, high time in order for its positive-going transition to latch output signal Q in its high state. This is seen in FIG. 3, wherein the positive transitions 60 and 80 in signal S latch output signal Q high, whereas the positive transition 70 in signal S has no effect upon output signal Q.

Figure 2:
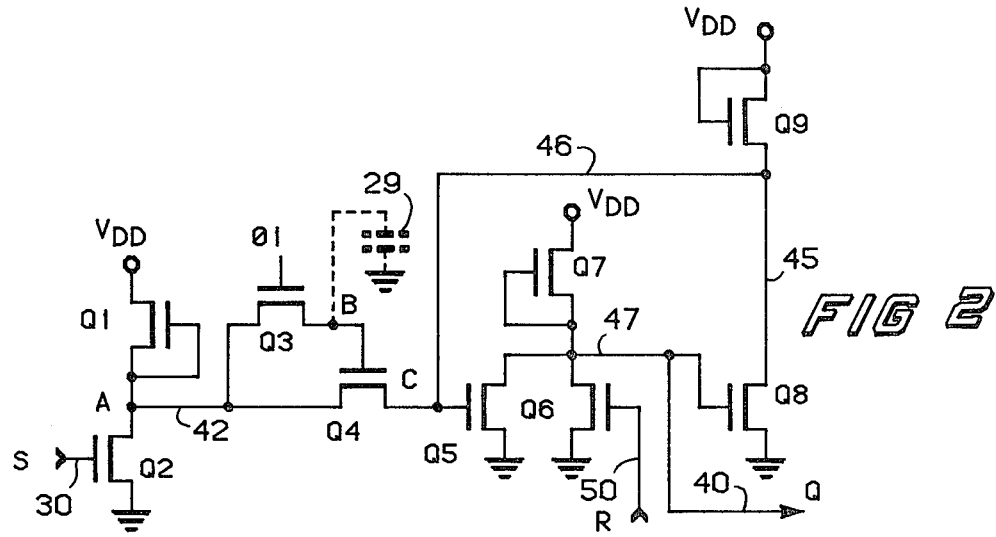
FIG. 2 shows a detailed circuit schematic illustrating a preferred embodiment of the invention.

With reference now to FIG. 2, a detailed circuit schematic of a preferred embodiment of the present invention is shown. A first MOS component or transistor Q2 has its gate coupled to conductor 30 for receiving the input signal S. Transistor Q2 has its source connected to ground and its drain connected to the source of depletion mode transistor Q1. Transistor Q1 has its gate connected to its source and its drain connected to supply voltage $V_{DD}$, which is typically about 5 volts. Transistors Q1 and Q2 operate as an MOS inverter, whose output A is the inverse of input signal S.

Coupled to the output A of the inverter comprising transistors Q1 and Q2 is a control and storage circuit comprising transistors Q3 and Q4. Transistors Q3 and Q4 have their respective drains connected to signal A via conductor 42. The gate of transistor Q3 is coupled to a control or clock signal $\phi1$. The source of transistor Q3 is connected to the gate of transistor Q4. Also connected to the gate of transistor Q4 is an inherent or intrinsic capacitance 29 shown in dashed lines. Capacitance 29 is a normally occurring attribute or electrical characteristic of an MOS circuit structure, due to the physical overlapping of conductive and non-conductive layers of semiconductor material forming such structure.

The remainder of the edge sense latch comprises a latch circuit portion. The latch circuit portion includes MOS transistors Q5 and Q8 in a cross-coupled configuration, wherein the gate of transistor Q5 is connected via conductors 45 and 46 to the drain of transistor Q8, and the gate of transistor Q8 is connected via conductor 47 to the drain of transistor Q5. The gate of transistor Q5 is also connected to the source of transistor Q4. The respective sources of transistors Q5 and Q8 are connected to ground. The output signal Q is generated by the latch circuit portion over conductor 40. An enhancement mode transistor Q9, serving as a load device, has its drain and gate coupled to supply voltage $V_{DD}$ and its source connected to conductors 45 and 46. Another load device in the form of depletion mode transistor Q7 has its drain coupled to supply voltage $V_{DD}$ and its gate and source connected to conductor 47. A reset transistor Q6 has its gate connected via conductor 50 to a reset signal R. Transistor Q6 has its drain connected to conductor 47 and its source connected to ground.

The operation of the edge sense latch will now be explained with specific reference to FIGS. 2 and 3. When input signal S drops between times T1 and T2, the output A of the inverter formed by transistors Q1 and Q2 rises. When clock $\phi1$ goes high at time T2, the potential at point B also rises, since transistor Q3 is now rendered conductive. While point B is high, charge is accumulated and stored in inherent capacitance 29. Gate transistor Q4 is conductive since the high level output of the inverter is transmitted through transistor Q3 to the gate of transistor Q4. Accordingly, point C is also high. Point C, however, has been high since the last resetting of the latch circuit, when a positive-going reset pulse R was applied to conductor 50, rendering transistor Q6 conductive and transistor Q8 non-conductive.

When input signal S goes high between times T4 and T5, a conductive path to ground is formed through transistor Q2. Although clock $\phi1$ is low, gate transistor Q4 remains conductive by virtue of the charge stored in inherent capacitance 29. Thus the potential at point C drops to ground, transistor Q5 is rendered nonconductive, and output signal Q goes high as indicated by rising edge 61. At time T5 the clock signal $\phi1$ goes high causing the remnant charge in the inherent capacitance 29 to be conducted through transistor Q3 and transistor Q2 to ground.

The latch circuit may be reset as illustrated between times T6 and T7. When reset signal R goes high, transistor Q6 is rendered conductive providing an uninterrupted path to ground and, as a consequence, output signal Q drops. At the same time transistor Q8 is rendered non-conductive, and the potential at point C rises.

The edge sense latch is not responsive to a rising edge in input signal S which occurs entirely within the time when clock $\phi1$ is low, as for example between times T10 and T11. Since $\phi1$ is low, the potential at point B cannot rise, and the inherent capacitance 29 cannot be charged. As a consequence, when signal S goes high the potential at point C cannot drop, since gate transistor Q4 remains non-conductive, and transistor Q5 does not turn off.

It will be apparent to those skilled in the art that the disclosed Edge Sense Detector may be modified in numerous ways any may assume many embodiments other than the preferred form specifically set out and described above. For example, the particular phase or logic level relationship between the detected transition in the input signal S and the transition in the output signal Q may be provided in any desired combination by making suitable changes to the circuitry.

Accordingly, it is intended by the appended claims to cover all modifications of the invention which fall within the true spirit and scope of the invention.

What is claimed is:

1. An MOS edge sense latch comprising:
    a first MOS component responsive to an input signal having first and second states;
    a second MOS component coupled to said first MOS component and responsive to a clock signal having first and second states, said second MOS component including capacitance means which is charged when said input signal and said clock signal are at their respective first and second states and a gate means, said gate means being conductive when said input signal and said clock signal are at said respective second and first states or when said capacitance means contains a predetermined level of charge; and
    a latch circuit having an output terminal normally set to a first state and including third and fourth MOS components each having an input and an output, the input of said third MOS component being coupled to said gate means and to the output of said fourth MOS component, and the input of said fourth MOS component being coupled to said output terminal and to the output of said third MOS component, said output terminal being set to a second state only when said capacitance means contains said predetermined level of charge and said input signal changes to said second state.

2. The edge sense latch recited in claim 1, wherein said latch circuit further comprises means for resetting said output terminal to said first state.

3. The edge sense latch recited in claim 2, wherein said resetting means comprises a fifth MOS component including gate, source, and drain elements.

4. The edge sense latch recited in claim 1, wherein each of said MOS components includes gate, source, and drain elements.

5. The edge sense latch recited in claim 4, wherein said gate means comprises an MOS component including gate, source, and drain elements.

6. The edge sense latch recited in claim 4, further comprising first and second potentials, said first potential being coupled to the drain elements of each of said MOS components, said second potential being coupled to the source elements of said first, third, and fourth MOS components, said source element of said second MOS component being coupled to said gate means, said gate elements of said first and second MOS components being coupled to said input signal and said clock signal, respectively, said gate element of said third MOS component being coupled to said gate means and to said drain element of said fourth MOS component, and said gate element of said fourth MOS component being coupled to said drain element of said third MOS component and to said output terminal.

7. The edge sense latch recited in claim 6, wherein said gate means comprises an MOS component including a gate element coupled to said source element of said second MOS component and to a first terminal of said capacitance means, a drain element coupled to said drain element of said second MOS component, and a source element coupled to said gate element of said third MOS component.

8. The edge sense latch recited in claim 7, wherein a second terminal of said capacitance means is coupled to said second potential.

9. The edge sense latch recited in claim 8, wherein said latch circuit further comprises a fifth MOS component for resetting said output terminal to said first state, said fifth MOS component including a drain element coupled to said gate element of said fourth MOS component, a source element coupled to said second potential, and a gate element coupled to a reset signal.

10. The edge sense latch recited in claim 8, futher comprising sixth, seventh, and eighth MOS components each having source, drain, and gate elements, said sixth MOS component having its drain element coupled to said first potential and its gate and source elements coupled to said drain of said first MOS component, said seventh MOS component having its drain element coupled to said first potential and its gate and source elements coupled to said drain of said third MOS component, and said eighth MOS component having its drain and gate elements coupled to said first potential and its source element coupled to said drain element of said fourth MOS component.

* * * * *